April 28, 1936. K. C. BLACK Re. 19,943

COMBINED RECTIFIER AND AMPLIFIER CIRCUIT

Original Filed April 25, 1930 2 Sheets-Sheet 1

Inventor:
Knox Charlton Black,

By Byrnes, Townsend + Potter,
Attorneys.

April 28, 1936. K. C. BLACK Re. 19,943

COMBINED RECTIFIER AND AMPLIFIER CIRCUIT

Original Filed April 25, 1930 2 Sheets-Sheet 2

Inventor:
Knox Charlton Black,
By Byrnes, Townsend & Potter,
Attorneys.

Reissued Apr. 28, 1936 Re. 19,943

UNITED STATES PATENT OFFICE 19,943

COMBINED RECTIFIER AND AMPLIFIER CIRCUIT

Knox C. Black, Mountain Lakes, N. J., assignor, by mesne assignments, to Radio Corporation of America, New York, N. Y., a corporation of Delaware Original No. 1,876,841, dated September 13, 1932, Serial No. 447,303, April 25, 1930. Application for reissue March 27, 1933, Serial No. 663,075

16 Claims. (Cl. 250—27)

This invention relates to vacuum tube circuits and more particularly to methods of and circuits for employing a multi-element vacuum tube both as a demodulator or rectifier of carrier wave signals and as an amplifier for the signal voltage and/or the rectified voltage.

In accordance with the invention, the external circuits of a multi-element vacuum tube are so arranged that the cathode and another element function as a diode rectifier, and the cathode and two or more additional elements function as an amplifier. The amplification may precede or may follow the rectification, or reflex circuits may be provided for amplifying both before and after rectification. The known commercial tetrode and pentode tubes having coaxial, cylindrical elements may be employed, but for some circuit arrangement, improved operation may be attained when the element acting as the anode for diode rectification is positioned outside of the electron stream established between the amplifier elements.

Objects of the invention are to provide methods of and circuits for effecting both amplification and rectification of a signal with a single multi-element vacuum tube. More particularly, objects are to provide methods of and circuits for employing a multi-element tube for the rectification of a signal and for the amplification of the signal at carrier and/or audio frequencies.

Figure 1:
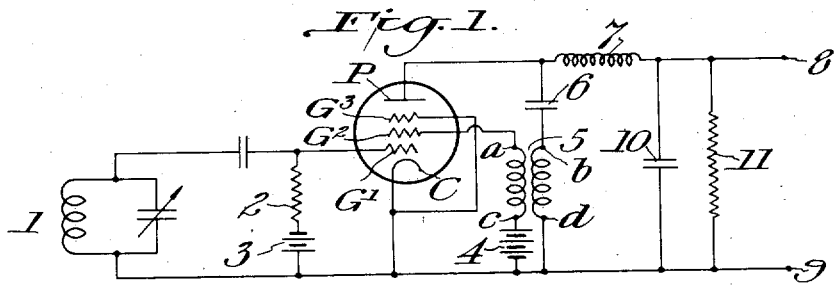

These and other objects of the invention will be apparent from the following specification, when taken with the accompanying drawings, in which, Fig. 1 is a circuit diagram of one embodiment of the invention.

Figures 2A, 2B, 2C:
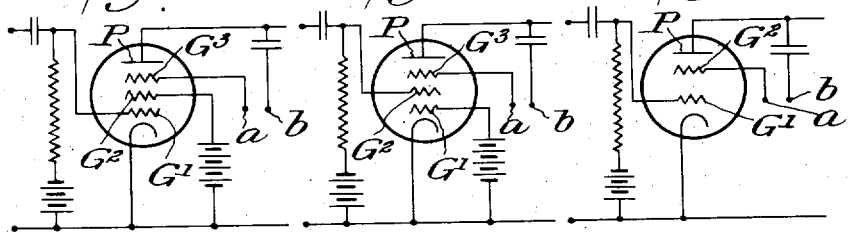

Figs. 2*a* to 2*c* are fragmentary circuit diagrams illustrating other embodiments of the invention.

Figs. 3*a* to 3*e* illustrate forms of coupling devices which could be substituted in the circut of Fig. 1, Figs. 4, 5 and 6 illustrate reflex circuits for amplifying both before and after diode demodulation of the signal.

Operation in accordance with the present invention is predicated upon the fact that any tube element in the electron field from a cathode will, irrespective of the operation of other tube elements, give satisfactory diode rectification in conjunction with the cathode, provided a small positive direct current voltage will cause appreciable current to flow through the electrode.

As shown diagrammatically in Fig. 1, the vacuum tube may be a pentode having three grids serially arranged in the electron field between the cathode C and plate P. The inner grid $G^1$ acts as a control grid for the amplification of the signal voltage across an input circuit 1, the bias being provided through resistance 2 by a battery 3. The outer grid $G^3$ is connected to the cathode, and the intermediate grid $G^2$ serves as the anode of a radio frequency amplifier. The amplifier anode circuit includes a source of current 4 and the primary winding of a radio frequency transformer 5.

The amplified radio frequency in the secondary of the transformer 5 is fed through a blocking condenser 6 of low radio frequency impedance to the plate P of the tube. The plate is also connected through the radio frequency choke 7 to the terminal 8 of the audio frequency output circuit. The other terminal 9 of the output circuit is connected to the cathode and a radio frequency by-pass condenser 10 and audio frequency resistance 11 are shunted across the output terminals 8, 9.

In this circuit, the plate P acts as the anode of an ordinary diode rectifier with parallel feed, i. e., the applied radio frequency voltage swings the plate positive during a part of the cycle and thereby causes rectified current to flow through the resistance 11 from the cathode to the plate. The circuit therefore acts as a combined radio frequency amplifier and diode detector and, so long as distortionless carrier amplification is afforded by the inner elements, the audio output will be a linear function of the applied radio frequency carrier amplitude and degree of modulation within those limits for which the customary diode causes this linear relation.

The circuit connections for securing both amplification and diode rectification may be varied within wide limits. For convenience of description, the respective upper terminals of the transformer windings in Fig. 1 are designated as *a*, *b*, and the low potential or grounded terminals of the primary and secondary windings are designated as *c*, *d*, respectively. The incomplete diagrams, Figs. 2*a*, 2*b* and 2*c*, show alternative connections to the vacuum tube. In these views, the terminals *a*, *b*, indicate the points of the network which are to be connected to that part of the stage network of Fig. 1 which lies to the right of points *a*, *b* of that figure. As shown in Fig. 2*a*, the carrier voltage may be impressed upon the inner grid $G^1$, the grid $G^2$ constitutes a screen grid and the outer grid $G^3$ is the anode element of the radio frequency amplifier. In the circuit of Fig. 2*b*, the grid $G^1$ is a space charge grid, the signal is impressed upon the intermediate grid $G^2$, and the grid $G^3$ is the amplifier anode. The Fig. 2*c* circuit shows the connections for a tetrode tube in which the inner grid $G^1$ constitutes the control grid and the outer grid $G^2$ is the amplifier anode.

Figures 3A, 3B, 3C, 3D, 3E:
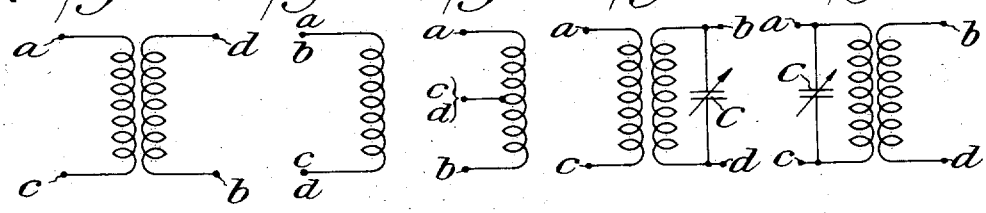
Figure 4:
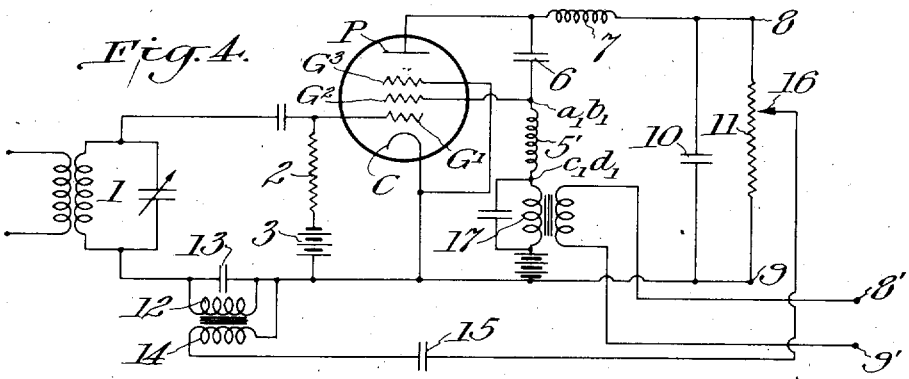

The series of views, Figs. 3*a* to 3*e*, show various forms of inductive coupling that may be employed between the amplifier anode circuit and the rectifier circuit. Any one of these coupling devices may be substituted for the transformer shown in Fig. 1 by connecting the terminals *a*, *b*, etc., to be correspondingly identified points of the Fig. 1 circuit. Fig. 3*a* shows a transformer coupling in which the direction of the windings is reversed; Fig. 3*b* shows an inductive impedance coupling; Fig. 3*c* shows an audio transformer coupling; and Figs. 3*d* and 3*e* show transformer couplings including a variable condenser C for adjusting the coupling circuit to resonance. Resistive or capacitive couplings may be employed and their design will be obvious to any person familiar with the construction and operation of radio frequency circuits.

When the performance of an amplifier-detector circuit is investigated, it will be found that the output voltage is a substantially linear function of the carrier voltage for signals falling within the range of values for which the amplifier elements act as a distortionless amplifier. With certain circuit conditions the emission of secondary electrons from the plate or diode element of the tube will give a non-linear response but, in general, the limitation of the linear region is due to overloading of the radio frequency amplifier.

The amplifier detector circuit contemplated by the invention presents the possibility of "reflexing" or feeding the audio voltage back onto the original control grid for further amplification of the signal at audio frequency. The reflex circuit shown in Fig. 4 employs the general circuit arrangement which is shown in Fig. 1 and corresponding elements of these two views are identified by the same reference numerals.

The transfer of amplified radio frequency voltage from the amplifier anode circuit to the rectifier circuit is effected by a radio frequency choke 5' that will be recognized as the coupling element shown in Fig. 3*b*. The secondary winding 12 of an audio frequency transformer is connected between the cathode C and the tuned input circuit 1, the winding 12 being shunted by a radio frequency by-pass condenser 13. The primary 14 of the audio frequency tranformer is connected through a condenser 15 of low audio frequency impedance to a tap 16 that may be adjusted along the resistance 11, and to the tube cathode. The amplified audio frequency output is made available across the terminals 8', 9' of a transformer whose primary winding 17 is connected between the radio frequency choke 5' and the cathode. The operation of this reflex circuit will be apparent from the above description of the Fig. 1 circuit.

Figure 5:
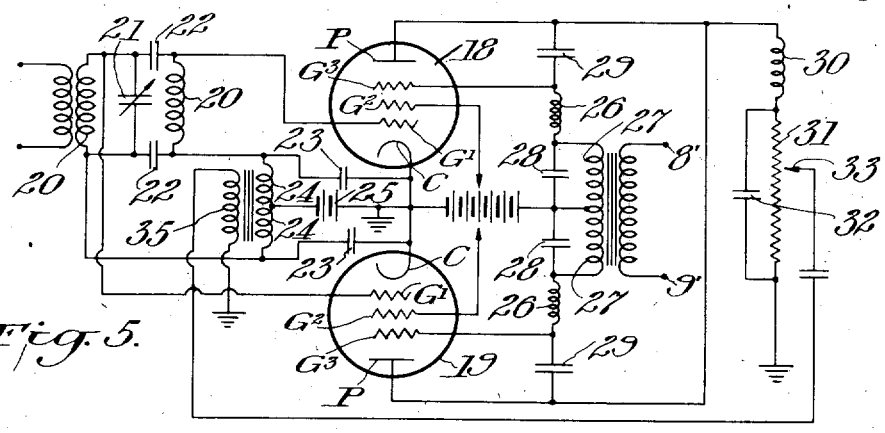
Figure 6:
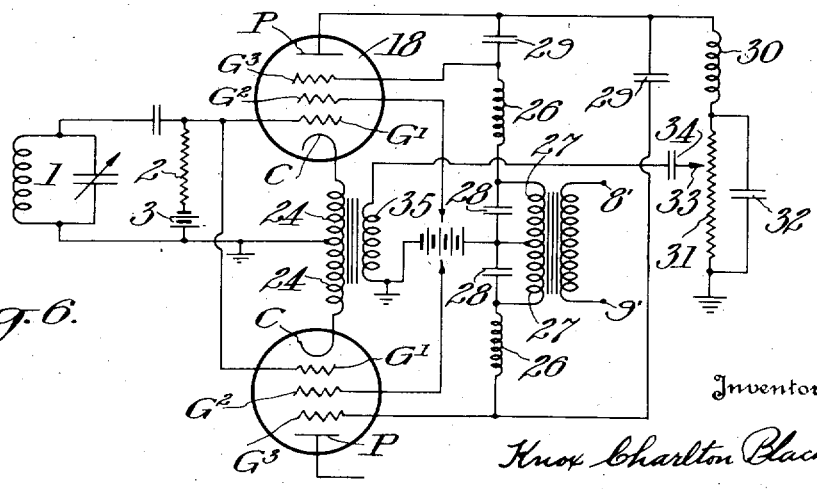

The reflex circuits of Figs. 5 and 6 show possible arrangements in which two tubes operate in parallel for radio frequency amplification and diode rectification, and in push-pull for audio frequencies. The general system of circuit connections is shown in Fig. 2*a*, i. e., the amplifier action is essentially that of a triode having a screen grid.

In the arrangement shown in Fig. 5, the radio frequency input circuits for the tubes 18, 19 are substantially identical inductances 20 which may be simultaneously tuned to resonance by the variable condenser 21 and which may be, due to the blocking condensers 22, at different direct current or radio frequency potentials. The high potential terminals of the inductances 20 are connected to the control grids $G^1$ of the respective tubes, and the low potential terminals are connected to the cathode through the radio frequency by-pass condensers 23.

The inductances 20 are conductively connected to the cathodes through the secondary windings 24 of an audio frequency tranformer and the bias battery 25. The outer grids $G^3$ constitute the amplifier anode elements and are connected to the cathodes through radio frequency chokes 26 and the primary windings 27 of an audio frequency push-pull transformer, the windings being shunted by radio frequency by-pass condensers 28. The respective amplifier anodes are connected to the plates P through the radio frequency condensers 29, the plates P being connected through the common radio frequency choke 30 to the audio frequency resistance 31 which is by-passed for radio frequencies by the condenser 32. The desired portion of the audio frequency voltage developed in the resistance 31 by the diode rectifier action is impressed, through the tap 33 and audio frequency condenser 34, upon the primary winding 35 of the push-pull transformer whose secondary windings 24 are included in the input circuits of the respective tubes. The Fig. 6 arrangement is a simplified modification of the Fig. 5 circuit which may not be desirable for all purposes since there is some degeneration due to the fact that the audio frequency impedances in the respective input circuits are also elements in the amplifier anode circuits of the respective tubes. The tuned input circuit 1 impresses the radio frequency signal in parallel upon the control grids $G^1$ of tubes 18, 19'. The general arrangement of the amplifier output circuits and the diode rectifier circuits may be substantially identical with that shown in Fig. 5, and corresponding elements of the two views will not be described in detail but are identified by the same reference numerals.

Attention is directed to the fact that, in the Fig. 6 circuit, only the tube 18 acts as a rectifier for the amplified radio frequency output of both tube 18 and tube 19. Tubes 18 and 19 are both shown as pentodes, no connection being made to the plate P of tube 19, but it is obvious that tube 19 may be a pentode. Tube 18 is preferably of the type described in my copending application, Ser. No. 446,098, filed April 21, 1930.

The secondary windings 24 of the audio frequency transformer are serially connected between the cathodes of tubes 18, 19, and the low potential terminal of the tuned input circuit 1. As stated above, this arrangement of the windings 24 as elements common to the grid and anode circuits of the amplifier will result in some degeneration, but this simplified circuit arrangement may be employed where high amplification is not essential.

Since these reflex circuits demonstrate the possibility of diode rectification and audio frequency amplification with a single tube, it will be apparent that the impressed radio frequency signal could be applied directly to the diode rectifier circuit. This use of a multi-element tube as a diode rectifier and audio frequency amplifier is described and claimed in my copending application Serial Number 446,755, filed April 23, 1930.

The method of operation by which radio frequency amplification is followed by diode detection has the special advantage that the operation of the preceding radio frequency amplifier stage is not affected by the diode rectification. The customary method of feeding a diode rectifier directly from the preceding amplifier stage is open to the objection that the diode, being a power consuming device, loads the input circuit of the amplifier stage and reduces the gain and selectivity. When the diode rectifier is fed, in accordance with this invention, from an additional amplifier stage comprising elements of the same vacuum tube, greater inherent sensitivity is obtained, due to the amplification in the amplifier-detector stage, and the gain and selectivity of the preceding stage are maintained at their normal values.

It will be understood that the specific circuits which are shown in the drawings are merely illustrative of the invention and that there is a wide latitude in the choice of tube constructions and of circuit arrangements for effecting operation in accordance with the spirit of my invention as set forth in the following claims.

I claim:

1. The combination with a vacuum tube having a cathode, a diode element, a control grid and an amplifier anode, of impedance associated with said cathode and diode element to constitute a diode rectifier circuit; impedances associated with said cathode, grid and anode to constitute amplifier input and output circuits, and coupling between certain of said impedances to transfer signal energy between said rectifier circuit and one of said amplifier circuits, whereby the signal may be amplified and rectified by said vacuum tube, a second tube provided with a cathode, diode element, control grid and amplifier anode, and electrode circuits corresponding to those of the first tube connected to the electrodes of the second tube.

2. In a combined amplifier-detector stage, the combination with a vacuum tube having a cathode and a plurality of elements, of circuit connections between one of said elements and said cathode to constitute a diode rectifier, circuit connections cooperating with a plurality of other elements and said cathode to constitute amplifier input and output circuits, and a second tube, having electrodes similar to said first tube, and electrode circuits corresponding to those of the first tube connected to the electrodes of the second tube.

3. A combined radio frequency amplifier-detector stage comprising a tube provided with a cathode, plate, control grid and auxiliary cold electrode, a radio frequency signal circuit connected between the cathode and control grid, a transformer having its primary in the auxiliary electrode circuit, a condenser of low radio frequency impedance connected between said plate and transformer secondary to feed the amplified signal energy in the secondary circuit to said plate, a radio frequency choke and resistor in series connected between the cathode and plate, said plate and cathode providing a diode rectifier of amplified signals and causing rectified current to flow through said resistor.

4. A combined radio frequency amplifier-detector stage comprising a tube provided with a cathode, plate, control grid and auxiliary cold electrode, a radio frequency signal circuit connected between the cathode and control grid, a transformer having its primary in the auxiliary electrode circuit, a condenser of low radio frequency impedance connected between said plate and transformer secondary to feed the amplified signal energy in the secondary circuit to said plate, a radio frequency choke and resistor in series connected between the cathode and plate, said plate and cathode providing a diode rectifier of amplified signals and causing rectified current to flow through said resistor, the audio output across said resistor being a linear function of the amplitude and degree of modulation of the signal energy applied between said control grid and cathode.

5. A combined radio frequency amplifier-detector stage comprising a tube provided with a cathode, plate, control grid and auxiliary cold electrode, a radio frequency signal circuit connected between the cathode and control grid, a transformer having its primary in the auxiliary electrode circuit, a condenser of low radio frequency impedance connected between said plate and transformer secondary to feed the amplified signal energy in the secondary circuit to said plate, a radio frequency choke and resistor in series connected between the cathode and plate, said plate and cathode providing a diode rectifier of amplified signals and causing rectified current to flow through said resistor, said auxiliary cold electrode being a positive screen grid disposed between the plate and control grid.

6. A combined radio frequency amplifier-detector stage comprising a tube provided with a cathode, plate, control grid and auxiliary cold electrode, a radio frequency signal circuit connected between the cathode and control grid, a transformer having its primary in the auxiliary electrode circuit, a condenser of low radio frequency impedance connected between said plate and transformer secondary to feed the amplified signal energy in the secondary circuit to said plate, a radio frequency choke and resistor in series connected between the cathode and plate, said plate and cathode providing a diode rectifier of amplified signals and causing rectified current to flow through said resistor, and a positive cold electrode disposed between the cathode and control grid.

7. A combined radio frequency amplifier-detector stage comprising a tube provided with a cathode, plate, control grid and auxiliary cold electrode, a radio frequency signal circuit connected between the cathode and control grid, a transformer having its primary in the auxiliary electrode circuit, a condenser of low radio frequency impedance connected between said plate and transformer secondary to feed the amplified signal energy in the secondary circuit to said plate, a radio frequency choke and resistor in series connected between the cathode and plate, said plate and cathode providing a diode rectifier of amplified signals and causing rectified current to flow through said resistor, and means for tuning said transformer to a desired signal frequency.

8. A combined radio frequency amplifier-detector-audio frequency amplifier stage comprising a tube provided with a cathode, plate, control grid and at least one auxiliary positive cold electrode, a signal input circuit between the cathode and control grid, a path between the cathode, auxiliary electrode and plate including in series a signal frequency coupling means and a condenser of low impedance to signal energy, a second path between the cathode and plate including in series a signal frequency choke and an audio frequency load impedance, a path of low impedance to audio frequency energy connected between said load impedance and the said signal circuit, and means in said first path adapted to furnish to an audio utilization means amplified audio frequency energy in the auxiliary cold electrode circuit.

9. A combined radio frequency amplifier-detector-audio frequency amplifier stage comprising a tube provided with a cathode, plate, control grid and at least one auxiliary positive cold electrode, a signal input circuit between the cathode and control grid, a path between the cathode, auxiliary electrode and plate including in series a signal frequency coupling means and a condenser of low impedance to signal energy, a second path between the cathode and plate including in series a signal frequency choke and an audio frequency load impedance, a path of low impedance to audio frequency energy adjustably connected between a point on said load impedance and the said signal circuit, and means in said first path adapted to furnish to an audio utilization means amplified audio frequency energy in the auxiliary cold electrode circuit.

10. A combined radio frequency amplifier-detector-audio frequency amplifier stage comprising a tube provided with a cathode, plate, control grid and at least one auxiliary positive cold electrode, a signal input circuit between the cathode and control grid, a path between the cathode, auxiliary electrode and plate including in series a signal frequency coupling means and a condenser of low impedance to signal energy, a second path between the cathode and plate including in series a signal frequency choke and an audio frequency load impedance, a path of low impedance to audio frequency energy connected between said load impedance and the said signal circuit, and means in said first path adapted to furnish to an audio utilization means amplified audio frequency energy in the auxiliary cold electrode circuit, said load impedance consisting of a resistor.

11. A a receiver comprising a tube provided with a cathode, a diode element, a control grid and an amplifier grid, a source of signal energy coupled to said control grid and cathode, a rectifier circuit between said cathode and diode element, an amplifier circuit coupled to said cathode, amplifier grid and diode element, and a load circuit including a resistor coupled to said rectifier circuit, and additional means including an audio frequency transformer for transmitting rectified voltage developed across said resistor to said control grid and cathode.

12. In a signal receiver, a pair of tubes each provided with a cathode, signal grid, plate and auxiliary grid, a radio frequency input circuit for the tubes including a common inductance tuned to resonance by a condenser, the high potential terminal of the inductance being connected to the signal grids of the respective tubes, and the low potential terminal being connected to the cathode, the inductance being connected to the cathodes through the secondary winding of an audio frequency input transformer, the auxiliary grids being the signal amplifier anode elements, and being connected to the cathodes through radio frequency chokes and the primary windings of an audio frequency push-pull output transformer, the respective amplifier anodes being connected to the plates through radio frequency condensers, a common radio frequency choke connecting the plates to an audio frequency load resistance, a desired portion of the audio frequency voltage developed across the load resistance being impressed upon the primary winding of the transformer whose secondary winding is included in the input circuits of the respective tubes.

13. In a signal receiver, a multi-function tube provided with a cathode, a signal grid, an anode and a positive screen grid between the signal grid and anode, a signal input circuit connected between the cathode and signal grid, an inductive reactance having a high impedance to signal currents connected between the screen grid and cathode, a capacitor of low impedance to signal currents in series with the anode and said reactance, and a resistive load arranged, in series between the cathode and anode of the tube, to be traversed by the space current therebetween.

14. In a receiver as defined in claim 13, means connected to said reactance for tuning the screen grid circuit to the frequency to which said input circuit is tuned.

15. In a receiver as defined in claim 13, an auxiliary grid in said tube at substantially cathode potential, said auxiliary grid being disposed between the screen grid and anode.

16. In a receiver as defined in claim 13, means for maintaining the signal grid at a substantial negative bias with respect to the cathode whereby the signal currents impressed on the control grid are amplified in the screen grid circuit.

KNOX C. BLACK.